: US005650672A

United States Patent [19]

Curd

[11] Patent Number: 5,650,672
[45] Date of Patent: Jul. 22, 1997

[54] HIGH-VOLTAGE POWER MULTIPLEXOR

[76] Inventor: Derek R. Curd, 373 River Oaks Cir., #702, San Jose, Calif. 95134

[21] Appl. No.: 533,413

[22] Filed: Sep. 25, 1995

[51] Int. Cl.$^6$ .................................................. H01H 35/00
[52] U.S. Cl. ..................... 307/130; 364/492; 365/189.09; 365/189.11; 307/43; 307/75; 307/80; 307/81; 307/85; 307/86; 307/70
[58] Field of Search .................. 364/492; 365/189.09, 365/189.11; 307/43, 75, 80, 81, 85, 86, 70, 130

[56] References Cited

U.S. PATENT DOCUMENTS 4,556,804  12/1985  Dewitt .................................. 307/296
4,568,834   2/1986  Sherman et al. .................... 250/551

OTHER PUBLICATIONS

"The Programmable Logic Data Book" copyright 1994, third edition, available from Xilinx, Inc., 2100 Logic Drive, San Jose, CA 95124.

Primary Examiner—Jonathan Wysocki
Assistant Examiner—Kim Lockett
Attorney, Agent, or Firm—Hickman & Beyer; Skjerven, Morrill, MacPherson, Franklin & Friel; Jeanette S. Harms

[57] ABSTRACT

A multiplexor having a multiplexor control input terminal for selectively providing one of a plurality of conductor voltage levels to a conductor. The multiplexor includes a first switch, which is coupled to the conductor, for providing a first conductor voltage level to the conductor. A second switch is also included and coupled to the conductor for providing a second conductor voltage level to the conductor. To provide a selective discharge path for the conductor during switching, the multiplexor further includes a third switch coupled to the conductor. A discharge circuit is also provided and coupled to the conductor and the third switch for sensing the voltage level of the conductor to turn on the third switch as necessary at the early stage of switching among conductor voltage levels.

25 Claims, 4 Drawing Sheets

H
HIGH-VOLTAGE POWER MULTIPLEXOR

CROSS-REFERENCE TO RELATED APPLICATIONS

The present application is related to application Ser. No. 08/5333131, filed on the same date as this application, entitled Programmable Logic Device with Configurable Power Supply by inventors Napoleon W. Lee, Derek R. Curd, Sholeh Diba, Prasad Sastry, Mihai Statovici and Kameswara K. Rao, and to U.S. Pat. No. 5563827 issued on Oct. 8, 1996, also filed on the same date as this application, entitled Wordline Driver for Flash PLD by inventors Napoleon W. Lee, Derek R. Curd, Wei-Yi Ku, Sholeh Diba, and George H. Simmons, both of which are incorporated herein by this reference.

BACKGROUND OF THE INVENTION

The present invention relates generally to power multiplexors. More particularly, the present invention relates to power multiplexors which, in response to control input signals, selectively and efficiently provide a plurality of high-voltage levels to a common conductor.

Certain circuits require a plurality of voltage levels on a given conductor at various times for their operation. By way of example, there exists a type of integrated circuit known as Programmable Logic Devices (PLD's), which typically make use of one or more programmable interconnect arrays to configure themselves to a specific user's design. The programmable interconnect arrays are typically composed of some type of nonvolatile, floating gate memory cell (e.g., EPROM, EEPROM, flash EPROM, and the like), which requires a plurality of voltage levels, some of which are high-voltage, to program, erase, and verify the cell. As the term is used herein, high-voltage refers to, voltage levels above the normal supply voltage, Vcc, of the device, which is typically between approximately 3 volts and 5 volts for most circuits.

By way of example, programming a memory cell of a PLD may require a voltage level of approximately 10 –12 volts on its gate. To erase that memory cell, a voltage level of approximately 0 volts may be required on the same gate. Verifying the result of programming may require a voltage level of 7–8 volts also on the gate of the memory cell while verifying the result of erasure may require yet another gate voltage level, e.g., 2–3 volts. For further information regarding Programmable Logic Devices (PLD's) in general, reference may be made to a publication entitled *The Programmable Logic Data Book* (1995 ed.), available from Xilinx, Inc. of San Jose, Calif., which publication is incorporated herein by reference in its entirety for all purposes.

In the prior art, discrete voltage sources, typically in the form of power supplies that are physically separate from the integrated circuit whose conductor requires the multiple voltage levels, are often used to directly supply the various voltage levels to that conductor. For example, PLD's that are programmed out-of-system, e.g., when placed in a programming socket, typically have their memory cell gates sourced by power supplies in the programmer. In these off-chip power supplies, multiple voltage levels may be generated and supplied to the PLD independent of the PLD's Vcc supply voltage. Further, the amount of current supplied by the off-chip power supplies to the target circuit in these applications is not a limiting factor.

In some cases, it may be desirable to shrink the voltage sources and place them on chip, even directly on the same chip that requires the multiple voltage levels. When so implemented, the miniaturized voltage sources typically must generate all the required voltage levels, using a host of different circuits such as charge pumps, reference voltages, and the like, from the supply voltage Vcc. A high-voltage power multiplexor is then needed to switch among the circuits to make use of the different voltage levels generated thereby.

Further, the miniaturized voltage sources can usually supply only a limited amount of current, say a few hundred microamps. For these miniaturized on-chip voltage sources, greater output current usually comes at the expense of chip size since a high-power voltage source typically requires a greater circuit area to implement than one which supplies a lower output current. To minimize chip size and power consumption, it is therefore desirable to use as few high-power on-chip voltage sources as possible.

Because of the size, power, and other constraints imposed by the placement of voltage sources on chip, it is therefore highly desirable to devise a power multiplexing scheme that can switch, responsive to control signals, among the multiple voltage sources to supply the common conductor with the required voltage levels in an efficient manner.

SUMMARY OF THE INVENTION

The present invention relates generally to efficient high-voltage power multiplexors. In one embodiment, the invention relates to a multiplexor having a multiplexor control input terminal for selectively providing one of a plurality of conductor voltage levels to a conductor coupled to its output. The multiplexor includes a first switch, which is coupled to the conductor for providing a first one of the plurality of conductor voltage levels to the conductor. The multiplexor further includes a second switch, which is also coupled to the conductor, for providing a second one of the plurality of conductor voltage levels to the conductor.

To provide a selective discharge path for the conductor, the multiplexor further includes a third switch coupled to the conductor. A discharge circuit is also provided and coupled to the third switch for controlling that third switch. The discharge circuit turns on the third switch to pull, responsive to an activation signal on the multiplexor control input terminal, a voltage level on the conductor to a first voltage level. The aforementioned first voltage level represents a voltage level that is sufficient to allow the first switch to turn on to provide the first one of the plurality of conductor voltage levels to the conductor. When the voltage level of the conductor is discharged down to the first voltage level, the discharge circuit turns off the third switch, advantageously drawing no more current.

In another embodiment, the invention relates to a method for selectively providing, responsive to a control input signal, one of a plurality of conductor voltage levels to a conductor. The method includes the step of coupling a first switch to the conductor and to a first voltage source, as well as the step of coupling a second switch to the conductor and to a second voltage source. The first voltage source and the second voltage source supply different voltage levels for providing the bus with different ones of the plurality of conductor voltage levels when required.

The method also includes the step of coupling a third switch to the conductor and a reference voltage level to provide a selective discharge path for the conductor. A discharge circuit is coupled to both the conductor and the third switch, enabling the third switch to pull the conductor, responsive to the control input signal, to a voltage level that is sufficient to allow either the first switch or the second switch to provide respectively the first one or the second one of the plurality of conductor voltage levels to the conductor. Advantageously, the third switch stops discharging the conductor when the voltage level of the conductor reaches the voltage level that is sufficient to allow either the first switch or the second switch to turn on as required.

In yet another embodiment, the invention relates to a method for selectively providing a first bus voltage level and a second bus voltage level to a bus that is coupled to a gate of a programmable logic device cell. The method includes the step of providing, using a first switch, the first bus voltage level to the bus. Upon receiving a control signal to provide the second bus voltage level to the bus, the method discharges the bus using a discharge circuit, thereby causing a voltage level of the bus to be reduced.

When the voltage level of the bus reaches a predefined voltage level, the method terminates the discharging step. Further, the method includes the step of providing, using a second switch, the second bus voltage level to the bus after the bus is discharged to the predefined voltage level. In this embodiment, the predefined voltage level represents a voltage level that is sufficient to allow the second switch to turn on and provide the second bus voltage level to the bus.

In yet another embodiment, the invention relates to a multiplexor which has a multiplexor control input terminal for selectively providing one of a plurality of conductor voltage levels to a conductor. The multiplexor includes a first switch, which is coupled to the aforementioned conductor, for providing a first one of the plurality of conductor voltage levels to the conductor. The multiplexor further includes a second switch, which is also coupled to the conductor, for providing a second one of the aforementioned plurality of conductor voltage levels to the conductor. In this embodiment, the second one of the plurality of conductor voltage levels is different from the first one of the plurality of conductor voltage levels.

In accordance with this embodiment, the multiplexor further includes a pulldown device, which is also coupled to the conductor. The pulldown device permits the first switch to turn on more rapidly, responsive to a control signal on the multiplexor control input terminal, to pull a voltage level on the conductor from the second one of the plurality of conductor voltage levels to the first one of the plurality of conductor voltage levels. The ability of the pulldown device to more rapidly allow the first switch to turn on is advantageous since the second one of the plurality of conductor voltage levels is a voltage level that, when present on the conductor, inhibits the first switch from turning on.

BRIEF DESCRIPTION OF THE DRAWINGS

Additional advantages of the invention will become apparent upon reading the following detailed description and upon reference to the drawings, in which.

DETAILED DESCRIPTION OF THE INVENTION

Figure 1:
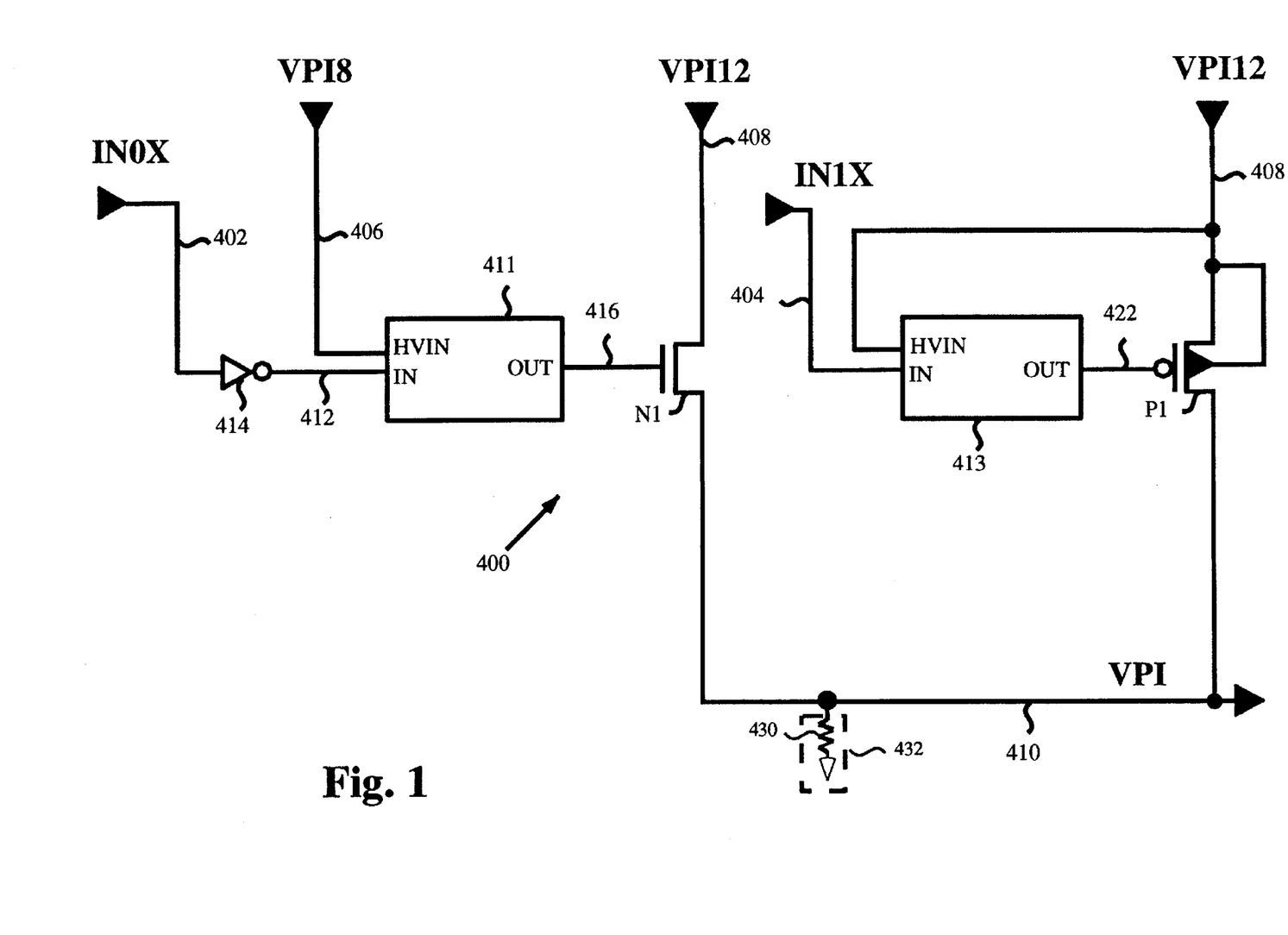
FIG. 1 illustrates, in one embodiment of the present invention, a high-voltage power multiplexor.

FIG. 1 is a circuit diagram illustrating, in one embodiment of the present invention, a high-voltage power multiplexor. Among its many advantages, the high-voltage power multiplexor of FIG. 1 requires only one high-power, area-intensive voltage source for providing a plurality of voltage levels at its output. A power multiplexor, such as that shown in FIG. 1, takes as inputs a plurality of input control signals. Responsive to the control signals, switches within the power multiplexor selectively pull the voltage level of the multiplexor output, which may be coupled to a conducting bus, to approximately the voltage level of one of the voltage sources.

Referring now to FIG. 1, there is shown a power multiplexor 400, which has two multiplexor control inputs: IN0X on a terminal 402 and IN1X on a terminal 404. In the embodiment of FIG. 1, these control inputs are active low although such is not a requirement. It should be apparent to those skilled in the art given this disclosure that power multiplexor 400 may be modified to work with active high control inputs. Power multiplexor 400 is further coupled to two voltage sources: VPI8 on a terminal 406 and VPI12 on a terminal 408. For discussion purposes, voltage source VPI8 supplies approximately 8 volts and voltage source VPI12 supplies approximately 12 volts, although they may be arranged to supply other voltage values if desired since the specific voltage values supplied by the voltage sources are not central to the present invention.

Figure 2:
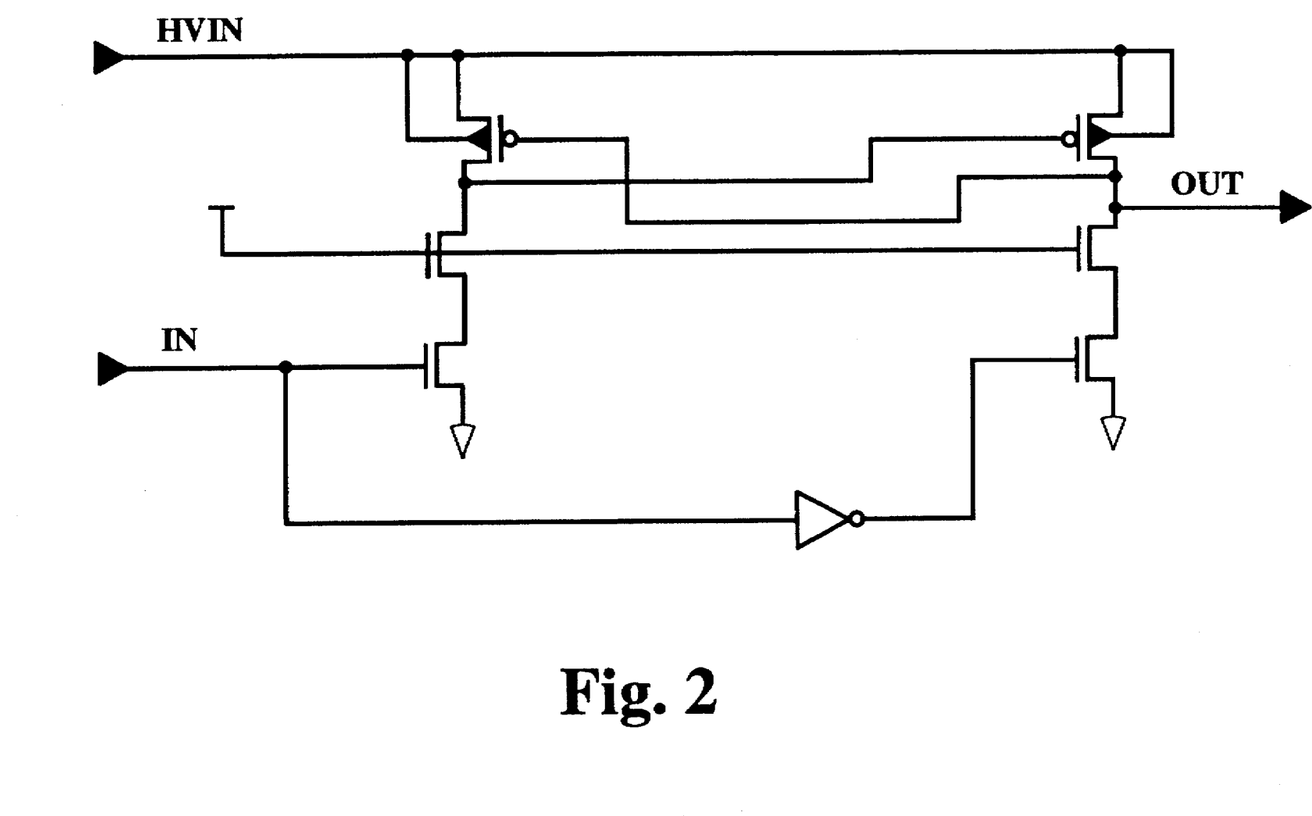
FIG. 2 is a circuit diagram illustrating a representative level shifter for translating CMOS (complementary metal oxide semiconductor) level signals to high-voltage level signals.

There are further shown in FIG. 1 two level shifters 411 and 413. A level shifter, also known as a high-voltage flip-flop, shifts the voltage level of an input signal at its IN input to another voltage level at its OUT output. A reference input HVIN sets the maximum voltage level the OUT output may have. By way of example, if an input signal having a voltage level of 0 volts is present at the IN input of level shifter 411, its OUT output will register approximately 0 volts. On the other hand, if the IN input of level shifter 411 is at Vcc, its OUT output will be translated to the level of its reference input, or VPI8 in this case. For illustration purposes, the schematics of a level shifter for translating CMOS (complementary metal oxide semiconductor) level signals to high-voltage signals is shown in FIG. 2.

There is also shown coupled to power multiplexor 400 an output terminal 410 for coupling with a power bus VPI. Assume initially that power bus VPI is at approximately 0 volts, i.e., completely discharged. When control input IN0X goes active (low), control input IN1X becomes inactive (high). The low control input IN0X causes a node 412 to go high via inverter 414. Node 412, being at Vcc, causes an output terminal 416 of level shifter 411 to rise to its reference input level, or to the voltage level of voltage source VPI8 in the example of FIG. 1, which is 8 volts.

Since output terminal 416 of level shifter 411 is coupled to the gate of an n-channel switch N1, a voltage level of 8 volts at the gate of n-channel switch N1 turns on n-channel switch N1 and drives power bus VPI with voltage source VPI12. However, the voltage level on power bus VPI can only achieve a level of VPI8-Vtn since the voltage level at the drain of n-channel switch N1 is inherently limited to approximately one threshold voltage below its gate level.

Note that the power multiplexor disclosed herein advantageously requires only one high-power voltage source, e.g., voltage source VPI12. In other words, current is supplied to power bus VPI by voltage source VPI12 irrespective of whether n-channel switch N1 or p-channel switch P1 controls the voltage level on power bus VPI. Voltage source VPI8 serves primarily to supply a bus voltage reference level to the gate of switch N1 and therefore sources almost no current even when power bus VPI is pulled by the on switch N1 to the voltage level of VPI8-Vtn. This feature therefore represents an advantage over the prior art since fewer large, high-power voltage sources must be provided in a circuit that requires multiple voltage levels. It is contemplated that only one high-power voltage source, e.g., an on-chip charge pump, is needed per high-voltage power multiplexor to provide the necessary current for driving power bus VPI at various voltage levels. The voltage levels themselves may be established by weaker, less area-intensive voltage sources in combination with n-channel devices such as n-channel device N1 (e.g., in the manner established by voltage source VPI8).

The voltage level VPI8-Vtn remains on power bus VPI until control input IN1X goes active (low) and control input IN0X becomes inactive (high). In this case, the high control input IN0X causes node 412 to go low via inverter 414, thereby causing output terminal 416 of level shifter 411 to go low. When the gate of n-channel switch N1 goes low, n-channel switch N1 is turned off, thereby decoupling voltage source VPI8 from power bus VPI.

At approximately the same time, the low control input IN1X causes an output terminal 422 of level shifter 413 to go low. Since output terminal 422 of level shifter 413 is coupled to the gate of a p-channel switch P1, the low voltage level on the gate of p-channel switch P1 causes it to turn on, again sourcing power bus VPI with voltage source VPI12. With n-channel switch N1 off, however, the voltage level on power bus VPI is no longer pulled to VPI8-Vtn. Instead, the voltage level on power bus VPI is controlled by the conductive p-channel switch P1, which will pass the full VPI12 voltage level onto power bus VPI.

When control input IN0X goes active (low) again, control input IN1X becomes inactive (high). The high control input IN1X turns off p-channel switch P1 (via level shifter 413), thereby allowing power bus VPI to float at the VPI12 voltage level. When control signal IN0X, which has gone low, tries to turn on n-channel switch N1, power bus VPI, being at the voltage level of VPI12 in the previous state, may still be higher than the value of VPI8-Vtn. Since the drain of n-channel switch N1 is coupled to power bus VPI, this condition effectively inhibits n-channel switch N1 from being turned on when a voltage level VPI8 is present at its gate. Instead of being at the voltage level of VPI8-Vtn as expected, power bus VPI is left floating at approximately the voltage level of VPI12. Although the discharge action of the parasitic capacitance associated with power bus VPI may eventually cause the voltage level of power bus VPI to drop to the point where n-channel switch N1 can turn on, such a delay is usually unacceptable for most applications.

In one embodiment, a weak pull down device, e.g., a weak resistor, may be coupled between power bus VPI and a reference voltage level, e.g., ground. FIG. 1 shows such a weak pulldown device in the form of a weak resistor 430 (shown in dotted box 432). The weak pull down device causes power bus VPI to discharge more rapidly in order to turn on n-channel switch N1, which then pulls power bus VPI to the expected value of VPI8-Vtn. In the context of the example of FIG. 1, n-channel switch N1 can turn on when power bus VPI is discharged to a voltage level below the voltage value of VPI8-Vtn.

While the high-power multiplexor of FIG. 1 represents an advantage over the prior art and is highly useful for certain applications, it is recognized that further reduction in power consumption may be desirable in certain situations. It is contemplated that in some power-sensitive applications, the presence of a constant pulldown on power bus VPI may cause more current to be drawn than is acceptable. For example, certain circuits may have such small charge pumps that a constant pull down on power bus VPI may overwhelm these small charge pumps, effectively preventing power bus VPI from being pulled up to the desired voltage level. Even when there is sufficient current to overcome the constant pulldown, the increase in circuit power consumption due to the presence of the constant pull down device may be undesirable in many applications where power consumption is of paramount concern.

Figure 3:
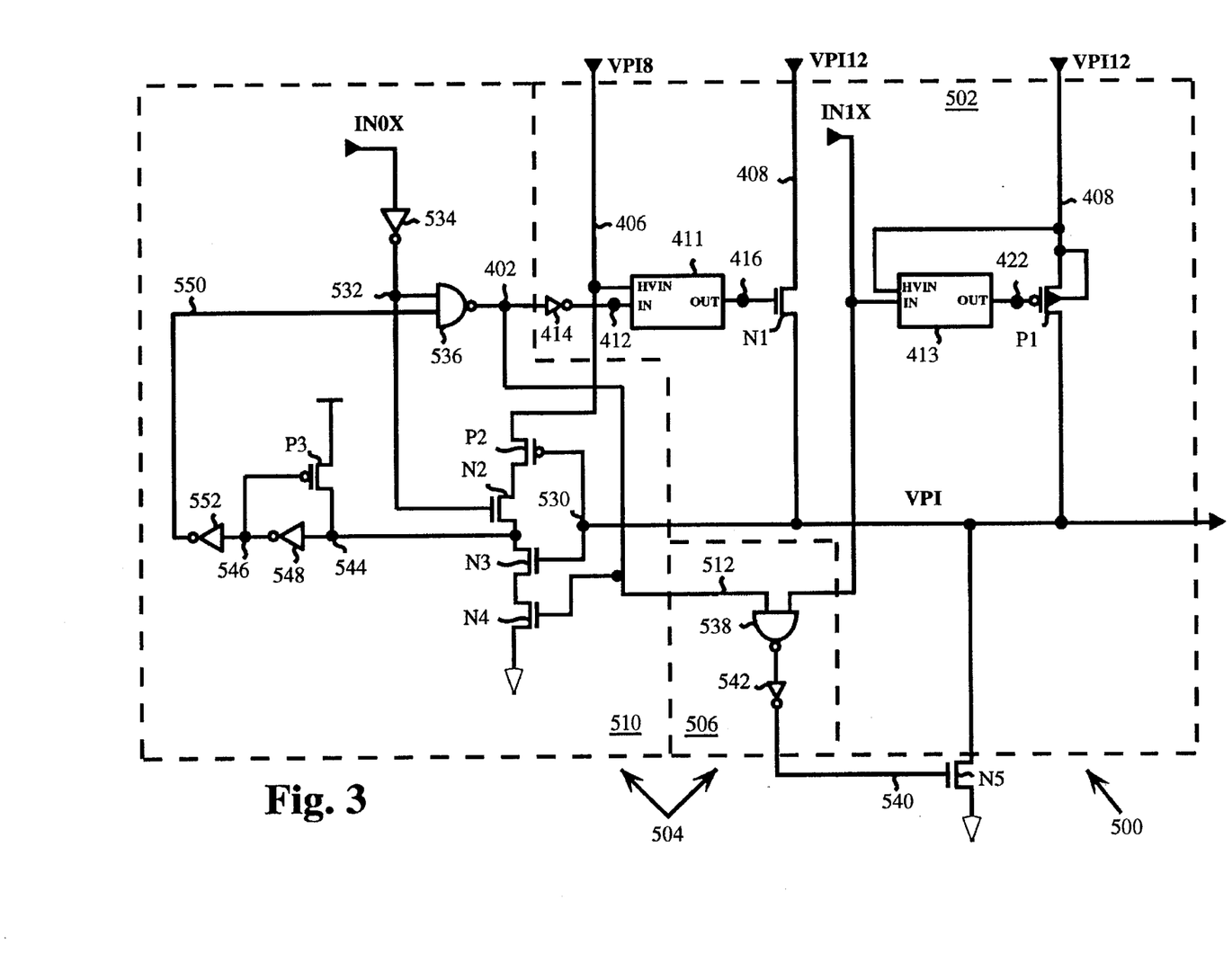
FIG. 3 illustrates, in another embodiment of the present invention, a high-voltage power multiplexor that utilizes a discharge circuit to efficiently switch among voltage sources.

FIG. 3 is a circuit diagram illustrating another high-voltage power multiplexor in accordance with another embodiment of the present invention. Instead of using a weak pulldown device to constantly discharge power bus VPI, the power multiplexor of FIG. 3 utilizes a discharge circuit to sense the voltage level of power bus VPI while switching among the different voltage sources and to quickly discharge power bus VPI, if necessary, to enable the appropriate n-channel switch to turn on. At other times, the discharge circuit is off, advantageously drawing almost no current.

Referring now to FIG. 3, multiplexor 500 includes two main circuits: a bus control circuit 502 and a discharge circuit 504. Except for the absence of the constant pulldown device, bus control circuit 502 is substantially identical to the multiplexor 400 of FIG. 1. Discharge circuit 504 further includes two circuits: a discharge switch control circuit 506 for controlling an n-channel discharge switch N5 and a voltage-sensing circuit 510. Voltage-sensing circuit 510 detects the voltage level of power bus VPI in the early stage of a switching cycle. If voltage-sensing circuit 510 ascertains that the voltage level on power bus VPI is too high for the appropriate n-channel switch to turn on as required, such as n-channel switch N1, voltage-sensing circuit 510 provides a switch control signal via conductor 512 to the discharge switch control circuit 506. Responsive to the switch control signal, the discharge switch control circuit 506 turns on discharge switch N5, thereby discharging power bus VPI toward ground.

When power bus VPI is pulled to a level sufficient to allow n-channel switch N1 to turn on, voltage-sensing circuit 510 provides another switch control signal to the discharge switch control circuit 506 via the same conductor 512. Upon receipt of this switch control signal, discharge control circuit 506 turns off discharge switch N5, thereby stopping the discharge of power bus VPI. Advantageously, almost no current is drawn through discharge circuit 504 after n-channel switch N1 turns on and pulls power bus VPI to the desired voltage level.

To illustrate in detail, consider the situation in which power bus VPI is initially at approximately 0 volts, i.e., completely discharged, and control input IN1X becomes active (low). In this case, control input IN0X becomes inactive (high). Again, it should be kept in mind that active low control signals are chosen herein for illustration purposes only and modifications to the disclosed high-voltage power multiplexor may be made by one skilled in the art to accommodate active high control signals if desired.

When control input IN1X is low, level shifter 413 produces at its OUT output a voltage level of approximately 0 volts, thereby turning on p-channel switch P1 to pull power bus VPI to the voltage level of voltage source VPI12. Therefore, the voltage at node 530, which is coupled to power bus VPI, rises to the voltage level of VPI12.

With control input IN0X high (inactive), the voltage at node 532 goes low via inverter 534. The low state of node 532 causes node 402 to go high via NAND gate 536, which in turn causes node 412 to go low via inverter 414. With node 412 low at its IN input, level shifter 411 produces approximately 0 volts at its OUT output, thereby turning off n-channel switch N1.

The high state of node 402 also turns on an n-channel switch N4. The low control input signal IN1X causes the output of a NAND gate 538 to go high, which in turn causes node 540 to go low via an inverter 542. With its gate low, n-channel discharge switch N5 is turned off, and no current is drawn from power bus VPI.

Further, the high state of node 530 (at approximately the voltage level of voltage source VPI12) turns on n-channel switch N3. Since n-channel switch N4 is also turned on by the high node 402, feedback node 544 is pulled to ground. In FIG. 3, switches N2 and P2 form a pullup circuit while switches N3 and N4 form a pulldown circuit for feedback node 544. Note that n-channel switches N3 and N4 are preferably appropriately sized to override the weak p-channel pullup switch P3 if necessary to pull down feedback node 544. In one embodiment, it has been found that a device length ratio of 2.5:2.5:10 for n-channel switch N3, n-channel switch N4, and p-channel switch P3 respectively is satisfactory.

When feedback node 544 goes low, node 546 goes high via inverter 548, thereby turning off p-channel switch P3. As is apparent, power bus VPI is at approximately the voltage level of voltage source VPI12 and feedback node 544 is at ground with almost no power being consumed via discharge circuit 504 while control input IN1X is active (low) and control input IN0X is inactive (high). The high state of node 546 further causes node 550 to go high via inverter 552.

When control input IN0X next goes active (low) to provide power bus VPI with approximately the voltage level of voltage source VPI8-Vtn, control input IN1X becomes inactive (high). The high control input IN1X causes level shifter 413 to produce approximately VPI12 at its OUT output, thereby turning off p-channel switch P1. Power bus VPI now floats at approximately the voltage level it was at prior to the turning off of p-channel switch P1, i.e., the voltage level of VPI12.

With control input IN0X low, node 532 goes high via inverter 534, thereby turning on an n-channel switch N2. Since node 530, which is coupled to power bus VPI, is floating at approximately the voltage level of voltage source VPI12, a p-channel switch P2 is off, thereby preventing feedback node 544 from being pulled high. Since feedback node 544 remains low, the state of node 550 is unchanged, i.e., low. The low node 550 causes the output of NAND gate 536 to remain high at node 402. The high node 402 results in a low node 412 (via inverter 414), and a low node 416 (via level shifter 411). N-channel switch N1 therefore remains off.

It should be noted that discharge circuit 504 advantageously keeps n-channel switch N1 from being turned on when power bus VPI still floats at the higher voltage level of voltage source VPI12. This is so despite the fact that the control inputs have been switched. As will be shown below, discharge circuit 504 then discharges power bus VPI to a level sufficient to permit n-channel switch N1 to turn on prior to issuing the signal to turn on n-channel switch N1 in order to control power bus VPI with voltage source VPI8.

The high state of node 402, in combination with the high control input IN1X, causes the output of NAND gate 538 to go low, which subsequently causes the output of inverter 542 to go high to turn on discharge switch N5. Power bus VPI begins to discharge and pull toward ground. Discharge switch N5 is preferably designed to ensure a rapid discharge without consuming an undue amount of power.

At some point in time, power bus VPI discharges to a voltage level which is slightly more than one threshold voltage, Vtp, below the voltage level of voltage source VPI8. When node 530, which is coupled to power bus VPI, reaches a voltage value below VPI8-Vtp, p-channel switch P2 is turned on. P-channel switch P2 and n-channel switch N2 are sized so as to be substantially stronger than n-channel switch N3 and n-channel switch N4. Since n-channel switch N2 is already on (by the low control input IN0X), the turning on of p-channel switch P2 causes feedback node 544 to be pulled up to a level of Vcc-Vtn (since the gate of n-channel switch N2 is at Vcc).

The high state of feedback node 544 further causes node 546 to go low via inverter 548. P-channel switch P3 therefore turns on, effectively latching feedback node 544 high at the full Vcc voltage level. The low node 546 also causes node 550 to go high (via inverter 552). In combination with the high node 532, the high node 550 causes NAND gate 536 to pull node 402 low. This low node 402, in combination with the high control input IN1X, then causes NAND gate 538 to pull its output high, which in turn causes inverter 542 to produce a low output. With the low inverter 542 output at its gate, discharge switch N5 is turned off, thereby stopping the discharge of power bus VPI. Advantageously, almost no current is consumed by discharge circuit 504 after discharge switch N5 is turned off. Note that the discharging of power bus VPI advantageously ceases when the voltage level of power bus VPI has been reduced to the point where it is possible to turn on n-channel switch N1, i.e., to voltage level VPI8-Vtp. For most processes, this value VPI8-Vtp is slightly below the value VPI8-Vtn, which is the maximum voltage level that power bus VPI may have and still enable n-channel switch N1 to turn on. The low state of node 402 also turns off n-channel switch N4, effectively latching the state of feedback node 544 high and advantageously preventing power from being consumed via n-channel switch N3 and n-channel switch N4.

Substantially simultaneously, the low state of node 402 also causes node 412 to go high via inverter 414, which in turn causes level shifter 411 to produce a voltage level approximating VPI8 at its OUT output (node 416). Since power bus VPI has been discharged to a value slightly below VPI8-Vtn, a voltage level of VPI8 at the gate of n-channel switch N1 can now turn on n-channel switch N1. Power bus VPI8 is now driven by n-channel switch N1, which supplies current from voltage source VPI12 while keeping the voltage level of power bus VPI at approximately VPI8-Vtn.

Power bus VPI will remain at this voltage level, i.e., approximately VPI8-Vtn, until control input IN1X goes active (low) and control input IN0X becomes inactive (high). Since power bus VPI is at voltage level VPI8-Vtn, which is below the voltage level of voltage source VPI12, p-channel switch P1 is in no danger of experiencing a forward biased condition. Further, the high control input IN0X causes node 532 to go low, thereby turning off n-channel switch N2. The same low node 532 causes node 402 to go high via NAND gate 536. Discharge circuit 504 is therefore reset, ready for the time when control input IN1X is deactivated (goes high) and control input IN0X becomes active (low).

Although the invention disclosed herein may be utilized in any circuit requiring a plurality of voltage levels on a common bus at various times, it is contemplated that the disclosed high-voltage power multiplexor is particularly well suited for delivering multiple voltage levels for programming, erasing, and verifying Programmable Logic Devices (PLD's) that are In-System Programmable (ISP). As the term is used herein, In-System Programmable (ISP) circuits refer to those circuits that can be programmed and/or erased while being affixed on a printed circuit board (in contrast to those that are programmed out of system in a specialized programming apparatus). In such ISP PLD's, the ability to rapidly and efficiently provide a power bus with a plurality of voltage levels is particularly advantageous. Since the disclosed power multiplexor requires only one high-power (and area-intensive) voltage source for supplying current to the power bus at all voltage levels, significant space saving on chip may be achieved. Further, the fact that the disclosed power multiplexor does not constantly discharge power bus VPI presents significant advantages, particularly in the area of power consumption.

Figure 4:
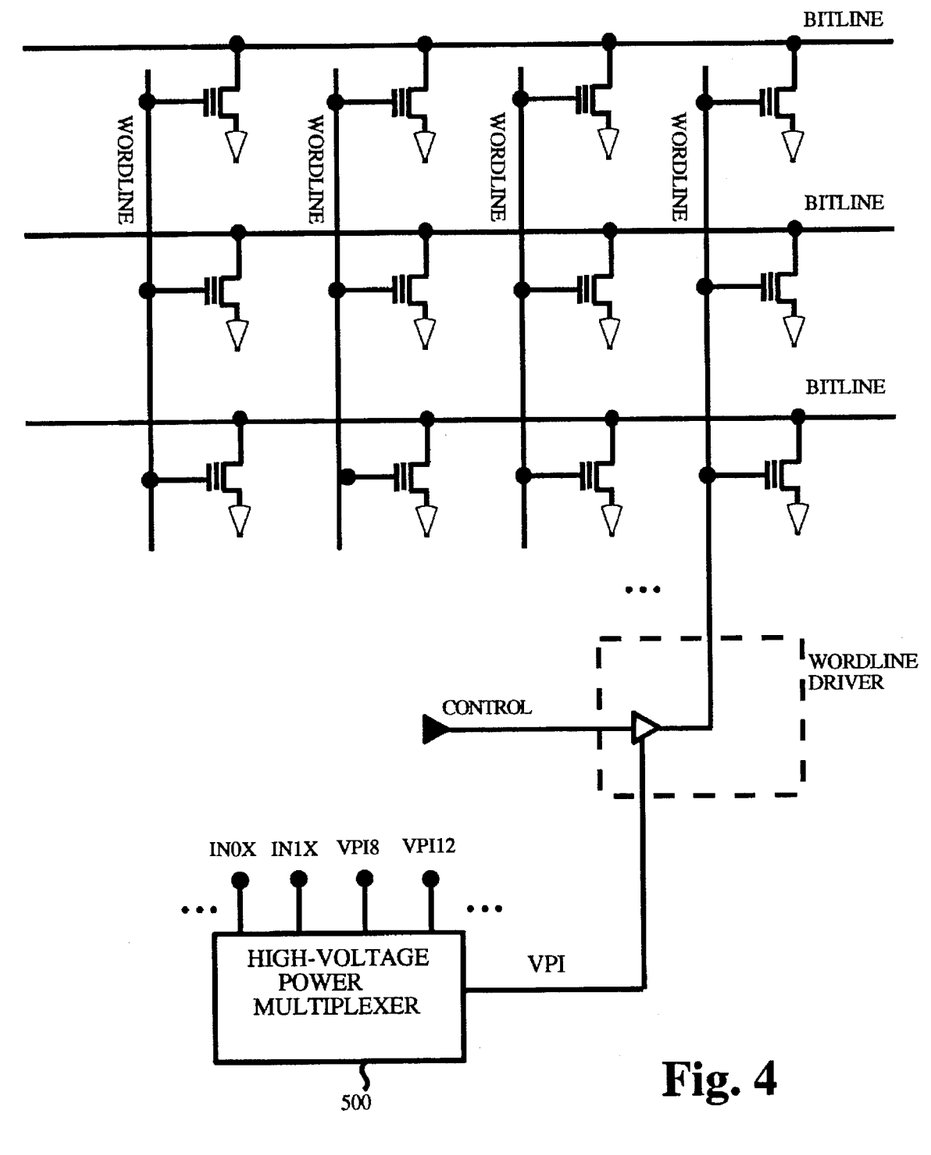
FIG. 4 illustrates, in yet another embodiment, an In-System Programmable (ISP) Programmable Logic Device (PLD), which advantageously derives its required voltage levels from the output of a high-voltage power multiplexor.

FIG. 4 shows, in yet another embodiment, an ISP PLD circuit in which the gates of the ISP PLD's memory cells are driven by common conductor buses, i.e., wordlines, which are sourced by power bus VPI of the disclosed high-voltage power multiplexor. Responsive to control signals, different voltage levels are supplied to the gates of the ISP PLD's memory cells, via the wordlines, to program, erase, and/or verify the memory cells. The drains of the cells are then coupled to common outputs of the arrays, i.e., the bitlines.

To generate the different voltage levels on the gates of the memory cells, the wordlines are driven by wordline drivers, one of which is shown in FIG. 4. The wordline drivers are in turn sourced by the VPI output of the disclosed high-voltage power multiplexor, e.g., power multiplexor 500 of FIG. 3.

It should be appreciated by those skilled in the art that although only two voltage levels are explicitly provided to power bus VPI of the disclosed power multiplexor, any number of voltage levels can in fact be provided. In one embodiment, additional voltage levels can be provided to power bus VPI by adding additional n-channel switches N1, level shifters 411, and inverters 414. It is of course preferable that each additional n-channel switch N1 be provided with its own voltage-sensing circuit 510 if additional power saving is desired, although this is not an absolute requirement. The outputs of all the provided voltage-sensing circuits 510 may then be inputted into NAND gate 538 to control discharge switch N5. Further, although both conductor bus voltage levels are chosen, for simplicity of illustration, to be high-voltage levels, e.g., 8 volts and 12 volts, it should be apparent that any voltage level may be provided by the disclosed power multiplexor. In fact, it is specifically contemplated that, in one embodiment, voltage levels as low as 2–3 volts be provided by the disclosed power multiplexor to verify erasure of ISP PLD's.

It should also be appreciated that although p-channel switch P1 is used in the example to illustrate the operation of the power multiplexor disclosed herein, switching among multiple voltage sources may also be performed by a high-voltage power multiplexor that utilizes solely n-channel switches. For example, the group consisting of p-channel switch P1 and level shifter 413 in FIG. 3 may be replaced by a group of devices consisting of n-channel switch N1, level shifter 411, and inverter 414 in order to allow an n-channel switch to pull power bus VPI to approximately the voltage level of VPI12-Vtn when control input IN1X becomes active (low).

Consequently, although only a few embodiments of the present invention have been described in detail, it should be understood that the present invention may be embodied in many other specific forms without departing from the spirit or scope of the invention. Substitutions and variations on the inventive concepts are possible and are within the skills of one skilled in the art given this disclosure. In view of the foregoing, it should be apparent that the present examples are to be considered as illustrative and not restrictive, and the invention is not to be limited to the details given herein, but may be modified within the scope of the appended claims.

What is claimed is:

1. A multiplexor having a multiplexor control input terminal for selectively providing one of a plurality of conductor voltage levels to a conductor, comprising:

a first switch coupled to said conductor for providing a first one of said plurality of conductor voltage levels to said conductor;

a second switch coupled to said conductor for providing a second one of said plurality of conductor voltage levels to said conductor;

a third switch coupled to said conductor; and a discharge circuit coupled to said third switch, said discharge circuit turns on said third switch to pull, responsive to an activation signal on said multiplexor control input terminal, a voltage level on said conductor to a first voltage level, said first voltage level being at a level sufficient to allow said first switch to turn on to provide said first one of said plurality of conductor voltage levels to said conductor, said discharge circuit turns off said third switch when said voltage level of said conductor reaches said first voltage level.

2. The multiplexor of claim 1, wherein said discharge circuit further comprises:

a switch control circuit coupled to said third switch; and a voltage-sensing circuit coupled to said conductor and said switch control circuit, said voltage-sensing circuit providing, responsive to said activation signal on said multiplexor control input terminal, a first switch control signal to said switch control circuit to enable said third switch to pull said voltage level on said conductor to said first voltage level, said voltage-sensing circuit further providing, when said voltage level of said conductor reaches said first voltage level, a second switch control signal to said switch control circuit to stop said third switch from continuing to pull said voltage level on said conductor to said first voltage level.

3. The multiplexor of claim 2 wherein said first switch is an n-channel device.

4. The multiplexor of claim 3, further comprising:

a level shifter having a level shifter reference terminal and a level shifter output terminal coupled to a control terminal of said first switch, wherein said level shifter produces a level shifter output voltage on said level shifter output terminal responsive to said activation signal on said multiplexor control input terminal, said level shifter output voltage having as its maximum voltage level approximately a maximum voltage level on said level shifter reference terminal.

5. The multiplexor of claim 4, wherein said voltage sensing circuit comprises:

a feedback terminal; and a pullup circuit coupled to said feedback terminal and said conductor, said pullup circuit pulling said feedback terminal high when said voltage potential on said conductor falls below said first voltage level.

6. The multiplexor of claim 5, wherein said voltage sensing circuit further comprises:

a pulldown circuit coupled to said feedback terminal and said conductor, said pulldown circuit pulling said feedback terminal low responsive to said activation signal on said multiplexor control input terminal, said pulldown circuit ceases pulling said feedback terminal low when said voltage potential on said conductor falls below said first voltage level.

7. The multiplexor of claim 1, wherein only one of the plurality of conductor voltage levels is supplied from a high power source, a remainder of the conductor voltage levels each being from a respective lower power source.

8. A method for selectively providing, responsive to a control input signal, one of a plurality of conductor voltage levels to a conductor, comprising:

coupling a first switch to said conductor and to a first voltage source;

coupling a second switch to said conductor and to a second voltage source, said first voltage source and said second voltage source supplying different voltage levels for providing said bus with different ones of said plurality of conductor voltage levels;

coupling a third switch to said conductor and a reference voltage level; and coupling a discharge circuit to said conductor and said third switch, whereby said third switch pulls, responsive to said control input signal, a voltage level on said conductor to a first voltage level, said first voltage level being at a level sufficient to allow either said first switch or said second switch to provide respectively said first one or said second one of said plurality of conductor voltage levels to said conductor, said third switch stops pulling said conductor when said voltage level of said conductor reaches said first voltage level.

9. The method of claim 8, wherein said discharge circuit includes a switch control circuit and a voltage sensing circuit, said step of coupling said discharge circuit to said conductor further comprises:

coupling said switch control circuit to said third switch; and coupling said voltage-sensing circuit to said conductor and said switch control circuit, whereby said voltage-sensing circuit provides, responsive to said control input signal, a first switch control signal to said switch control circuit to enable said third switch to pull said voltage level on said conductor to said first voltage level, said voltage-sensing circuit further providing, when said voltage level of said conductor reaches said first voltage level, a second switch control signal to said switch control circuit to stop said third switch from continuing to pull said voltage level on said conductor to said first voltage level.

10. The method of claim 9 wherein said first switch is an n-channel device.

11. The method of claim 10, further comprising:

coupling a level-shifting circuit having a level-shifting circuit reference terminal and a level-shifting circuit output terminal to a control terminal of said first switch, whereby said level-shifting circuit produces a level-shifting circuit output voltage on said level-shifting circuit output terminal responsive to said input control signal, said level-shifting circuit output voltage having as its maximum voltage level approximately a maximum voltage level on said level-shifting circuit reference terminal.

12. The method of claim 9, wherein said step of coupling said voltage sensing circuit to said conductor and said switch control circuit comprises:

providing a feedback terminal; and coupling a pulldown circuit to said feedback terminal, whereby said pulldown circuit pulls said feedback terminal low responsive to said control input signal, said pulldown circuit ceases pulling said feedback terminal low when said voltage level on said conductor falls below said first voltage level.

13. The method of claim 12, wherein said step of coupling said voltage sensing circuit to said conductor and said switch control circuit further comprises:

coupling a pullup circuit to said feedback terminal, whereby said pullup circuit pulls said feedback terminal high when said voltage level on said conductor falls below said first voltage level.

14. A method for selectively providing a first bus voltage level and a second bus voltage level to a bus, said bus being coupled to a gate of a programmable logic device cell, comprising:

providing, using a first switch, said first bus voltage level to said bus;

upon receiving a control signal to provide said second bus voltage level to said bus, discharging said bus using a discharge circuit, thereby causing a voltage level of said bus to be reduced;

terminating said discharging step when said voltage level of said bus reaches a predefined voltage level; and providing, using a second switch, said second bus voltage level to said bus after said bus is discharged to said predefined voltage level, wherein said predefined voltage level is at a level sufficient to allow said second switch to turn on and provide said second bus voltage level to said bus.

15. The method of claim 14 wherein said second switch is an n-channel device.

16. The method of claim 15 wherein said first bus voltage level is higher than said second bus voltage level, said first bus voltage level being a voltage level that inhibits said second switch from being turned on when approximately said second bus voltage level appears at a gate of said second switch.

17. The method of claim 16 wherein said first bus voltage level is around 12 volts and said second bus voltage level is around 8 volts.

18. The method of claim 16 wherein said discharging step comprises:

turning on a discharge device upon receiving said control signal to provide said second bus voltage level to said bus, said discharge device being coupled to said bus and ground, thereby causing charge carriers in said bus to be discharged to said ground.

19. The method of claim 18 wherein said step of terminating said discharging step comprises:

sensing said voltage level of said bus, using a voltage-sensing circuit;

outputting a control signal from said voltage-sensing circuit when said voltage-sensing circuit detects said voltage level of said bus to be below said predefined voltage level; and turning off said discharge device, responsive to said control signal from said voltage-sensing circuit, thereby preventing said bus from being further discharged when said voltage level of said bus is discharged to said predefined voltage level.

20. A multiplexor having a multiplexor control input terminal for selectively providing one of a plurality of conductor voltage levels to a conductor, comprising:

a first switch coupled to said conductor for providing a first one of said plurality of conductor voltage levels to said conductor;

a second switch coupled to said conductor for providing a second one of said plurality of conductor voltage levels to said conductor, said second one of said plurality of conductor voltage levels being different from said first one of said plurality of conductor voltage levels; and a pulldown device coupled to said conductor, said pulldown device permitting said first switch to turn on more rapidly, responsive to a control signal on said multiplexor control input terminal, to pull a voltage level on said conductor from said second one of said plurality of conductor voltage levels to said first one of said plurality of conductor voltage levels, wherein said second one of said plurality of conductor voltage levels being a voltage level that, when present on said conductor, inhibits said first switch from turning on.

21. The multiplexor of claim 20 wherein said pull down devices comprises a resistor coupled to said conductor and a reference voltage level.

22. The multiplexor of claim 21 wherein said first switch is an n-channel switch and said second switch is a p-channel switch.

23. The multiplexor of claim 21 wherein said first switch and said second switch are n-channel switches.

24. The multiplexor of claim 20, wherein only one of the plurality of conductor voltage levels is supplied from a high power source, a remainder of the conductor voltage levels each being from a respective lower power source.

25. A multiplexor for selectively providing one of a plurality of voltage levels to a conductor, comprising:

a first level shifter having a control terminal and a high voltage input terminal, the high voltage input terminal being connected to a first voltage level, and having an output terminal;

a first switch being coupled between the conductor and a second voltage level and having a control terminal the output to the output terminal of the first level shifter;

a second level shifter having a control terminal and a high voltage input terminal, the high voltage input terminal being connected to the second voltage level, and having an output terminal; and a second switch coupled between the conductor and the second voltage level, and having a control terminal coupled to the output terminal of the second level shifter.

* * * * *

UNITED STATES PATENT AND TRADEMARK OFFICE
CERTIFICATE OF CORRECTION

PATENT NO. : 5,650,672
DATED : July 22, 1997
INVENTOR(S) : Derek R. Curd

It is certified that error appears in the above-identified patent and that said Letters Patent is hereby corrected as shown below:

Col. 1, line 49, delete "(1995 ed.)" and insert --(1994 ed.)--

Col. 14, line 2, delete "devices" and insert --device--

Col. 14, line 20 after "a control terminal" insert --coupled to--

Col. 14, line 21 delete "output to the"

Signed and Sealed this

Twenty-third Day of February, 1999

Attest:

Q. TODD DICKINSON

*Attesting Officer*   *Acting Commissioner of Patents and Trademarks*

UNITED STATES PATENT AND TRADEMARK OFFICE
CERTIFICATE OF CORRECTION

PATENT NO. : 5,650,672
DATED : July 22, 1997
INVENTOR(S) : Derek R. Curd

It is certified that error appears in the above-identified patent and that said Letters Patent is hereby corrected as shown below:

On the title page, item [73], insert the folllwing, -- Xilinx, Inc., San Jose, Calif.--

Signed and Sealed this

Fourteenth Day of September, 1999

Attest:

Q. TODD DICKINSON

*Attesting Officer*　　　Acting Commissioner of Patents and Trademarks